(12) United States Patent
Tsuji et al.

(10) Patent No.: US 6,649,969 B2
(45) Date of Patent: Nov. 18, 2003

(54) NONVOLATILE SEMICONDUCTOR DEVICE (75) Inventors: Naoki Tsuji, Tokyo (JP); Akinobu Teramoto, Tokyo (JP); Kazutoshi Wakao, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/908,895

(22) Filed: Jul. 20, 2001

(65) Prior Publication Data

US 2002/0100928 A1 Aug. 1, 2002

(30) Foreign Application Priority Data

Jan. 26, 2001 (JP) ........................................ 2001-018708

(51) Int. Cl.[7] ............................................ H01L 29/788
(52) U.S. Cl. ........................ 257/316; 257/317; 257/321
(58) Field of Search ................................ 257/314–317, 257/321; 438/257, 263, 264

(56) References Cited

U.S. PATENT DOCUMENTS 5,895,246 A    4/1999  Lee
5,932,909 A  * 8/1999  Kato et al. ................... 257/316
6,337,518 B1 * 1/2002  Grill et al. ................... 257/758
6,448,666 B1 * 9/2002  Kudo et al. .................. 257/798
6,489,215 B2 * 12/2002 Mouli et al. ................. 438/400

FOREIGN PATENT DOCUMENTS

| JP | 05-048088  | 2/1993 |
| JP | 06-120490  | 4/1994 |
| JP | 11-111972  | 4/1999 |

* cited by examiner

Primary Examiner—Thien Tran
(74) Attorney, Agent, or Firm—McDermott, Will & Emery (57) ABSTRACT

The invention provides a nonvolatile semiconductor device, or the like. According to the fabrication process of the present invention, silica glass containing boron or phosphorous is used as a material of high absorbency, which is treated in the vapor phase HF atmosphere and, therefore, selective etching of silica glass, only, of high absorbency becomes possible so that a void area can be formed beneath the fin of the floating gate. Accordingly, the absolute value of the parasitic capacitance between the floating gate and the substrate is decreased. In addition, the degree of the fluctuation of the parasitic capacitance due to the manufacturing process can be restricted to a low level. Accordingly, a nonvolatile semiconductor device of high performance can be gained without lowering the yield.

3 Claims, 5 Drawing Sheets

NONVOLATILE SEMICONDUCTOR DEVICE

BACKGROUND OF THE INVENTION

1. Field of the Invention

The present invention relates to a structure of a semiconductor device and the fabrication process for the same. More specifically, the present invention relates to a structure of a nonvolatile semiconductor device having a floating gate and the fabrication process for the same.

2. Description of the Prior Art

Figure 11:
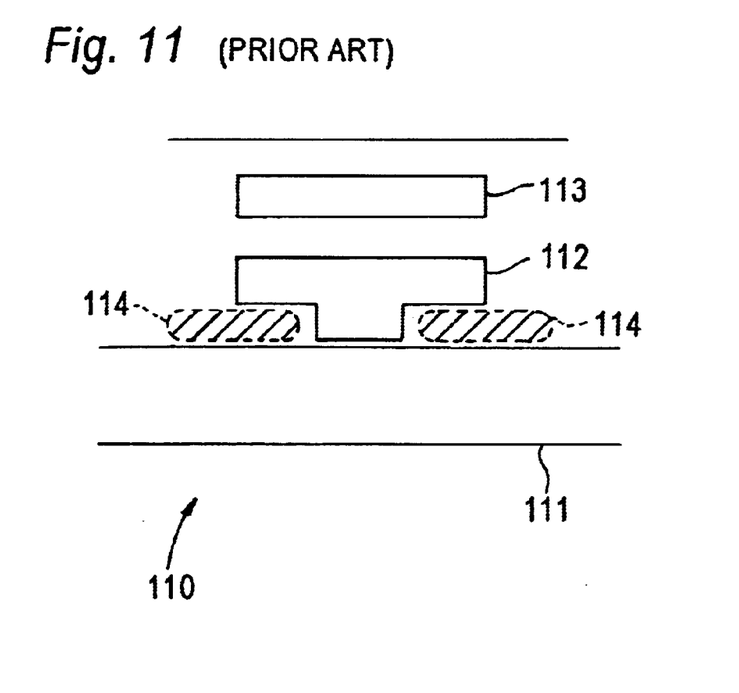
FIG. 11 is a cross section view of an AND type nonvolatile semiconductor device according to a prior art.

FIG. 11 is a cross section view of a conventional AND type nonvolatile semiconductor device 110. The nonvolatile semiconductor device 110 is a flash memory, or the like. Here, though not shown, an element isolation region and a peripheral circuit region are formed on both sides of a cell. The nonvolatile semiconductor device 110 has a T-shape floating gate 112 and a control gate 113 embedded in an oxide film (for example, TEOS film) deposited by chemical vapor deposition (hereinafter referred to as CVD) on a substrate 111. By adopting the T-shape floating gate 112, the overlapped area between the floating gate 112 and the control gate 113 can be increased. As a result, the capacitance between the floating gate 112 and the control gate 113 can be larger.

The reason for increasing the capacitance between the floating gate 112 and the control gate 113 is to improve the performance of the cell by increasing the coupling between the floating gate 112 and the control gate 113. In the following, a more detailed description is given. The capacitance between the floating gate 112 and the control gate 113 is denoted as C1 while the capacitance between the floating gate 112 and the substrate 111 is denoted as C2. For example, the larger C1 becomes in comparison with C2 the lower is the gate voltage for carrying out the writing operation or the erasing operation. In other words, the larger C1 becomes in comparison with C2 the shorter the writing time and the erasing time can be made with the same gate voltage, that is to say, the performance of the cell is increased. Accordingly, it is better the capacitance C1 between the floating gate 112 and the control gate 113 to be increased and, in addition, it is also better the capacitance C2 between the floating gate 112 and the substrate 111 to be decreased.

Capacitance C2 is formed mainly of two capacitances, that is, a capacitance C2-$a$ between the axis part (part in the vertical direction) of the T-shape floating gate 112 and the substrate 111 and a capacitance C2-$b$ between the arm part (part in the horizontal direction) of the T-shape floating gate 112 and the substrate 111. Capacitance C2-$a$ corresponds to a capacitance of a so-called tunnel region in a nonvolatile semiconductor, which is an essentially necessary part for the cell. On the other hand, capacitance C2-$b$ is a so-called parasitic capacitance which is essentially irrelevant to the operation of the cell.

Accordingly, when the capacitance C2-$b$ becomes smaller in the capacitance C2, the coupling between the floating gate 112 and the control gate 113 is increased so as to increase the performance of the cell.

In the structure of a conventional nonvolatile semiconductor device 110, however, it is difficult to make the parasitic capacitance C2-$b$ small. As for a more detailed description, it is desirable to make the distance between the arm part of the floating gate 112 and the substrate 111 larger, that is to say, to make the position of the arm part of the floating gate 112 higher above the substrate 111 in order to make the parasitic capacitance C2-$b$ small. However, it is difficult to make the position of the arm part higher because of the restriction of the gate etching process.

As for the description of the reason why the position of the arm part cannot be made higher, first, in the case that the position of the arm part is made higher, the length of the axis part, which is to be etched, inevitably increases in the vertical direction. In the etching process, generally, process dispersion, or the like, is taken into consideration and an over-etching of the actual amount of the object to be etched is carried out according to a predetermined ratio. Accordingly, in the case that the position of the arm part is made higher the etching amount increases because the etching distance becomes longer and over-etching is carried out. The gate etching, however, must be completed in the etching time to the degree where the tunnel oxide film, which exists under the gate, does not undergo penetration. In the case that the etching time is set for a long period of time, the tunnel oxide film is penetrated at the time of etching so as to cause an operation defect of the cell. And, in the case that the etching time is set for a short period of time, the gate material which must be etched remains so as to cause a short circuit between the cells. Accordingly, the etching time has an upper limit and a lower limit. Therefore, the etching distance of the axis part cannot be increased (position of the arm part cannot be made higher) without causing a decrease in the yield due to process dispersion.

In addition, the relative dielectric constant of the CDV oxide film 114, which exists between the floating gate 112 and the substrate 111, is approximately 4 so as to be a factor for increasing the parasitic capacitance.

SUMMARY OF THE INVENTION

An object of the present invention is to reduce parasitic capacitance between the floating gate and the substrate in a non-volatile semiconductor device without lowering the yield.

According to the first aspect of the invention, a process for fabricating a nonvolatile semiconductor device comprising a control gate and a floating gate having a fin part and an axis part is provided. The fabrication process comprises the steps of providing a substrate; forming a first insulating layer on the substrate; forming an axis part, made of a conductive material, of a floating gate on the first insulating layer; forming a source electrode and a drain electrode in the substrate; depositing an absorbent material on the first insulating layer and in the proximity of said formed axis part; forming a fin part, made of said conductive material, of the floating gate on said absorbent material to connect to said axis part ; forming a second insulating layer on said fin part; forming a control gate, made of a conductive material, on the formed second insulating layer; and etching said deposited absorbent material in a gas atmosphere to form a void area beneath the fin part.

According to the second aspect of the invention, a process for fabricating a nonvolatile semiconductor device comprising a control gate and a floating gate having a fin part and an axis part is provided. The fabrication process comprises the steps of providing a substrate; forming a first insulating layer on the substrate; forming an axis part, made of a conductive material, of a floating gate on the first insulating layer; forming a source electrode and a drain electrode in the substrate; depositing a material having relative dielectric constant of 3 or less, on the first insulating layer and in the proximity of said layered axis part; forming a fin part, made of said conductive material, of the floating gate on said material having relative dielectric constant of 3 or less to connect to said axis part; forming a second insulating layer on said fin part; and forming a control gate, made of a conductive material, on the formed second insulating layer. As a result, a layer of a material having a relatively low relative dielectric constant is formed beneath the fin of the floating gate.

It is an advantage of the invention that the absolute value of the parasitic capacitance between the floating gate and the substrate is decreased and that a nonvolatile semiconductor device of high performance can be obtained without lowering the yield.

It is another advantage of the invention that the degree of the fluctuation of the parasitic capacitance due to the manufacturing process can be restricted to a low level and a nonvolatile semiconductor device of high performance can be obtained without lowering the yield.

BRIEF DESCRIPTION OF THE DRAWINGS

These and other object and features of the present invention will become clear from the following description taken in conjunction with the preferred embodiments thereof with reference to the accompanying drawings, in which.

DETAILED DESCRIPTION OF THE PREFERRED EMBODIMENTS

In the following, the embodiment for carrying out the present invention is described in reference to the attached drawings.

First, the structure and the operation principle of a nonvolatile semiconductor device according to the present invention are schematically described. A more detailed structure of the nonvolatile semiconductor device 100 is described below with respect to the description of a fabrication process for the nonvolatile semiconductor device 100. Here in the specification, though an AND type nonvolatile semiconductor device is described as an example of the nonvolatile semiconductor device 100, the method of the present invention can be applied to a semiconductor device other than the AND type. In addition, a process according to the present invention can be applied to a semiconductor device with a gate of a fin (below described) structure in order to reduce the parasitic capacitance between the gate and the substrate.

Figure 1:
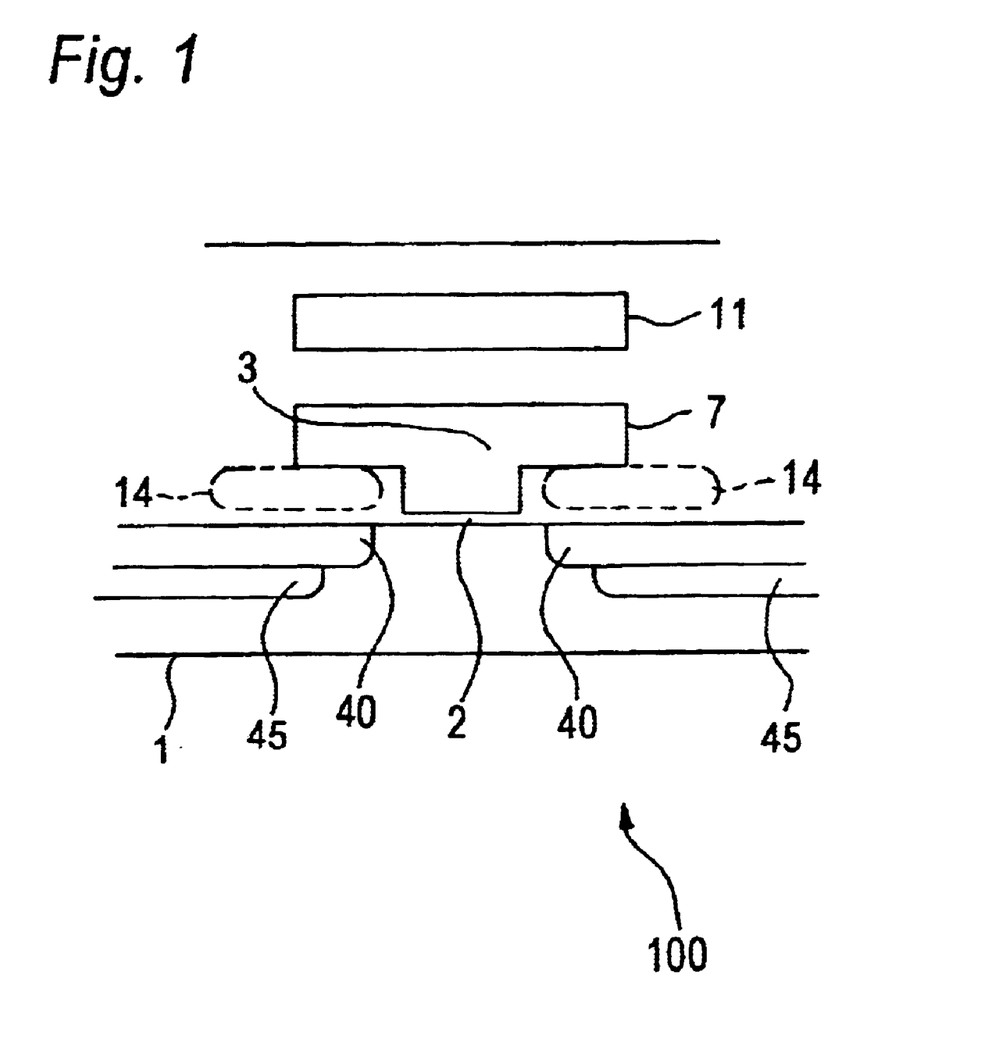
FIG. 1 is a cross sectional view of a nonvolatile semiconductor device.

FIG. 1 is a cross section view of the nonvolatile semiconductor device 100. The nonvolatile semiconductor device 100 has a plurality of memory elements (cells) and is utilized as a flash memory, or the like. Though only a single cell part is shown in the figure, an element isolation region and a peripheral circuit region are actually formed on both sides of the cell. The nonvolatile semiconductor device 100 has a T-shape floating gate 7 and a control gate 11 formed above the substrate 1. By adopting the T-shape floating gate 7, the capacitance between the floating gate 7 and the control gate 11 is increased in the same manner as in a prior art.

In addition, a tunnel oxide file 2 is provided between the substrate 1 and the floating gate 7 while two n- regions 40 of the memory cell transistor are formed in the substrate 1. The arm part (hereinafter, referred to as "fin") of the floating gate 7 which extends in the direction (horizontal direction) parallel to the substrate 1 exists above the two n- regions of the memory cell transistor. Here, the axis part 3 of the floating gate 7 which extends in the direction perpendicular (vertical direction) to the substrate 1 is hereinafter referred to as the "axis part." The floating gate 7 is formed of the fin part and the axis part.

One feature of the nonvolatile semiconductor device 100 according to the present invention exists in the formation of a void area in the region between the fin and the substrate 1. Another feature of the present invention exists in the formation of a film having relative dielectric constant is relatively low. Conventionally, an oxide film such as a TEOS film of which the relative dielectric constant is approximately 4 is formed in the above region. According to the structure of the present invention, the parasitic capacitance between the fin and the substrate 1 can be reduced to a greater degree than in the prior art by forming a void 14, of which the relative dielectric constant is 1, or a layer of film, of which the relative dielectric constant is lower than 4.

Next, the principle of the operation of the nonvolatile semiconductor device 100 as a memory is as follows. The nonvolatile semiconductor device 100 can read out stored data when a predetermined voltage is applied to the control gate 11 in accordance with the case where a current flows through the memory cell transistor formed on the substrate 1 and the case where the current does not flow. As for a detailed description, in the case that electrons are injected to the floating gate 7 so as to be charged in the negative, the turning on voltage Vth1 of the memory cell transistor becomes high relative to the voltage of the control gate 11 because of the influence of the electrons (written in condition). On the contrary, in the case on no charge to the negative, the turning on voltage Vth2 of the memory cell transistor is low relative to the voltage of the control gate 11 (non-written in condition). Accordingly, whether or not data are stored can be charged according to whether or not the memory cell transistor turns on when an intermediate voltage between the voltage Vth1 and the voltage Vth2 is applied to the control gate.

Here, it should be noticed that the floating gate 7 is completely isolated by a tunnel oxide film which exists between the floating gate 7 and the substrate 1 and through which electrons parse as well as by an ONO film which exists between the floating gate 7 and the control gate 11 and, therefore, the electrons existing in the floating gate 7 cannot be discharged. Thereby, the semiconductor memory device 100 functions as a nonvolatile memory.

Figure 2:
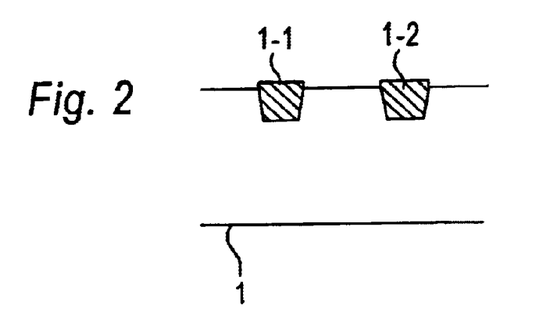
FIG. 2 is a diagram of a substrate wherein element isolation regions are formed.

Next, a fabrication process for the nonvolatile semiconductor device 100 is described. FIG. 2 shows a substrate 1 wherein element isolation regions 1-1 and 1-2 are formed. The element isolation regions 1-1 and 1-2 are formed as a shallow trench isolation, which is called as STI in which an insulator such as tetra etyle ortho silicate (hereinafter referred to as TEOS) is filled in the etched silicon substrate part and electrically insulates a plurality of transistors formed on the substrate 1 from each other. Next, an N well and a P well (not shown) are formed in the substrate 1. The N well can be formed by injecting, for example, phosphorous (P) at a high energy level while the P well can be formed by injecting, for example, boron (B) at a high energy level.

Figure 3:
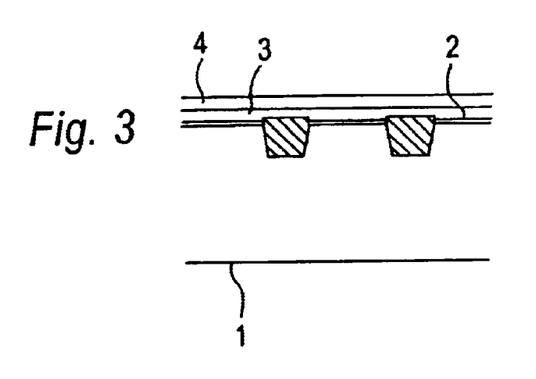
FIG. 3 is a diagram of a substrate wherein, additionally, a tunnel oxide film, a doped amorphous silicon film and a silicon nitride film are deposited.

In addition, FIG. 3 shows a substrate 1 wherein a tunnel oxide film 2 formed through thermal oxidation, a doped amorphous silicon film 3 and a silicon nitride film 4 are deposited. The tunnel oxide film 2 is an insulating layer of which the film thickness is approximately 9 nm. The tunnel oxide film 2 is a thin film so that electrons pass through when an intense electric field is applied. This flow of electrons is known in general as an FN tunnel current. The doped amorphous silicon film 3 later becomes an axis part of the floating gate, of which the film thickness is approximately 100 nm. The film thickness of the silicon nitride film 4 is approximately 200 nm. Here, in the present embodiment, "deposition" represents a deposition of a material utilizing a well-known deposition technology such as chemical vapor deposition (hereinafter referred to as CVD).

Figure 4:
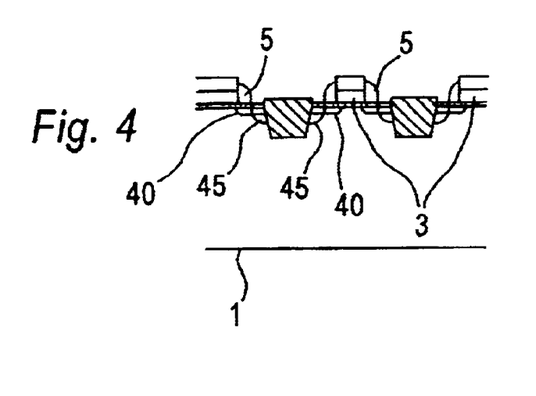
FIG. 4 is a diagram of a substrate wherein a memory cell transistor of an LDD structure is formed.

FIG. 4 shows a substrate 1 wherein a memory cell transistor of an lightly doped drain (hereinafter referred to as LDD) structure is formed. The formation process of the memory cell transistor is as follows. First, the resist applied on the substrate 1 as shown in FIG. 3 is patterned only in the memory cell part and the silicon nitride film 4 on the doped amorphous silicon 3 is etched. After that, the resist is moved. Then, by using a part of the silicon nitride film 4 patterned in the above manner as a mask, the doped amorphous silicon with thickness of approximately 100 nm is etched. Thereby, a part of the floating gate is formed between the element isolation regions.

After that, for example, arsenic (As) is injected in order to form n-regions 40 of the memory cell transistor. The injection is carried out in the number of approximately $2 \times 10^{14}$ at, for example, 40 KeV. In addition, after depositing a TEOS oxide film of approximately 50 nm, sidewalls 5 are formed through anisotropic etching (sidewall etching). Finally, arsenic (As) is injected across the sidewalls 5 in order to form N+ regions 45 of the memory cell transistor. The injection is carried out in the number of approximately $1 \times 10^{15}$ at, for example, 40 KeV. Through the above steps a memory cell transistor of the LDD structure can be formed.

Figure 5:
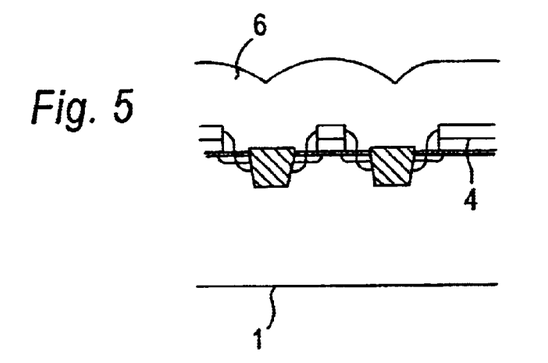
FIG. 5 is a diagram of a substrate wherein, additionally, an oxide film is formed.

FIG. 5 shows a substrate wherein an oxide film 6 is additionally formed. One of the characteristics of the present invention is to form this oxide film 6 through the deposition of silica glass, which is a material of high absorbency. In addition, the oxide film 6 is formed in the proximity of the doped amorphous silicon film 3, which later becomes an axis part of the floating gate and, more specifically, is formed so that the sidewalls are sandwiched between the doped amorphous silicon film 3 and the oxide film 6. Silica glass of which the absorbency is high is a material which contains, for example, one of boron (B) and phosphorous (P). Boron (B) and phosphorous (P) may both be included. As below described, a selective etching becomes possible with a vapor phase HF treatment by using silica glass of high absorbency so that a void area can be formed beneath the thin (FIG. 1). Here, conventionally the oxide film 6 is formed of TEOS as a material.

Figure 6:
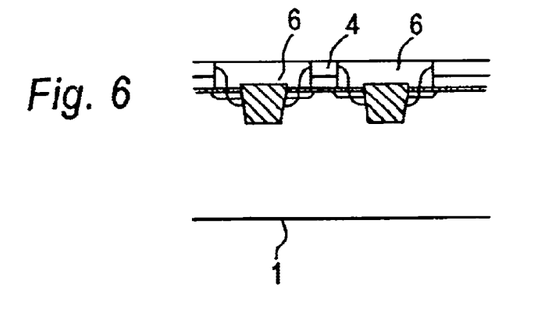
FIG. 6 is a diagram of a substrate wherein an oxide film is chemically and mechanically polished.

FIG. 6 shows a substrate 1 wherein the oxide film 6 is chemically mechanically polished. Through the chemical mechanical polishing (hereinafter referred to as CMP) the oxide film 6, located above the silicon nitride film 4 is removed.

Figure 7:
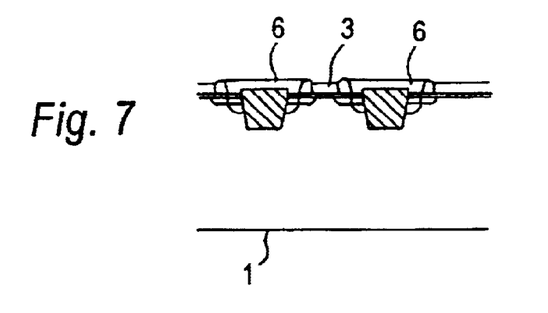
FIG. 7 is a diagram of a substrate wherein a doped amorphous silicon film is exposed.

In reference to FIG. 7, the form of the fin which is, additionally, formed on the exposed doped amorphous silicon film 3 can be made into a T-shape by using such a substrate 1. The substrate 1, as shown in FIG. 7, can be obtained through the following steps carried out on the substrate 1 as shown in FIG. 6. First, the silicon nitride film 4 and the oxide film 6 are submitted to oxide film dry etching. Etching of approximately 150 nm is carried out. Then, the silicon nitride film 4 on the doped amorphous silicon film 3 is removed by thermal phosphoric acid. Thereby, the heights of the top surface of the doped amorphous silicon film 3 and the top surface of the oxide film 6 become approximately uniform. Here, "doped amorphous silicon film 3" is, more specifically, a film part which exists between two element isolation regions and is an axis part of the floating gate. Through this process, the doped amorphous silicon film 3 is exposed.

Figure 8:
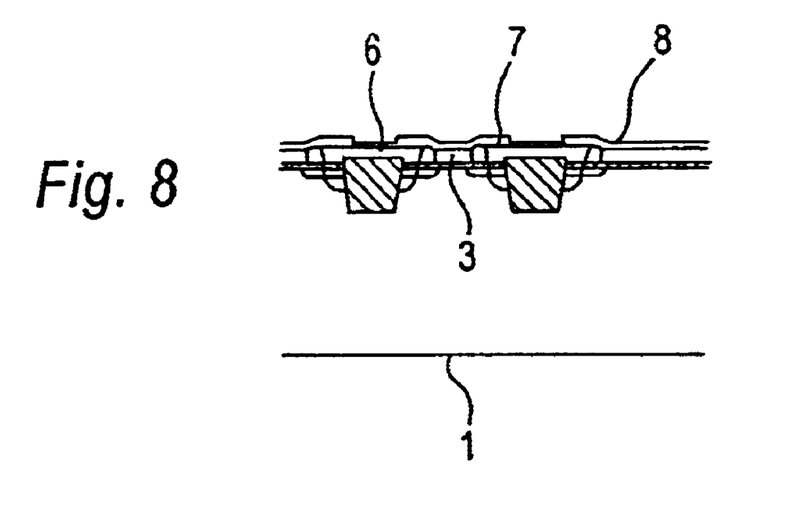
FIG. 8 is a diagram of a substrate wherein, additionally, a doped amorphous silicon film and an ONO film thereon are deposited.

FIG. 8 shows a substrate where, additionally, a doped amorphous silicon film 7, and an ONO (oxide-nitride-oxide) film 8 thereon, are deposited. First, the step of forming the film 7 is described. The doped amorphous silicon film 7 is deposited on the substrate 1 of FIG. 7. The thickness thereof is approximately 40 nm. Here, though films 3 and 7 are referred to as the same "doped amorphous silicon film," the doping amount of phosphorous (P) and other materials may be the same or may be different. Then, the resist is patterned and, by using this as a mask, the doped amorphous silicon film 7 is etched. Thereby, the fin of the floating gate is formed. That is to say, the doped amorphous silicon films 3 and 7 form the floating gate of the nonvolatile semiconductor device 100. As for the form of the floating gate, it is easy to give a T-shape by making the amount of etching appropriate.

Here, in accordance with the distance from the substrate I to the doped amorphous silicon film 7 (that is to say, the height of the fin from the substrate 1) the parasitic capacitance in between varies. From the viewpoint of the operation of the memory cell, it is better for the parasitic capacitance to be small, because the parasitic capacitance influences the capacitance between the floating gate and the substrate. Specifically, in the case that the parasitic capacitance is increased, the capacitance between the floating gate and the substrate is increased and the coupling ratio (i.e., C1/(C1+ C2)) is decreased, and, as a result, the writing in/erasing time of the memory cell may be longer.

Then, the ONO film 8 is deposited. The ONO film 8 is an insulating film of a three layered structure formed of an oxide film, a nitride film and an oxide film in the order starting from the nearest (lowest) to the substrate 1. The thickness of each is approximately 6 nm, approximately 10 nm and approximately 6 nm, in that order. The ONO film 8 is the same as the ONO film in a general nonvolatile semiconductor memory device. As is clear from the description so far, it is understood that the floating gate 3 and 7 contacts with a tunnel oxide film, which is an insulating layer that is between the below substrate 1 and the floating gate, and contacts with the ONO film which is an insulating layer on the top part of the floating gate.

Figure 9:
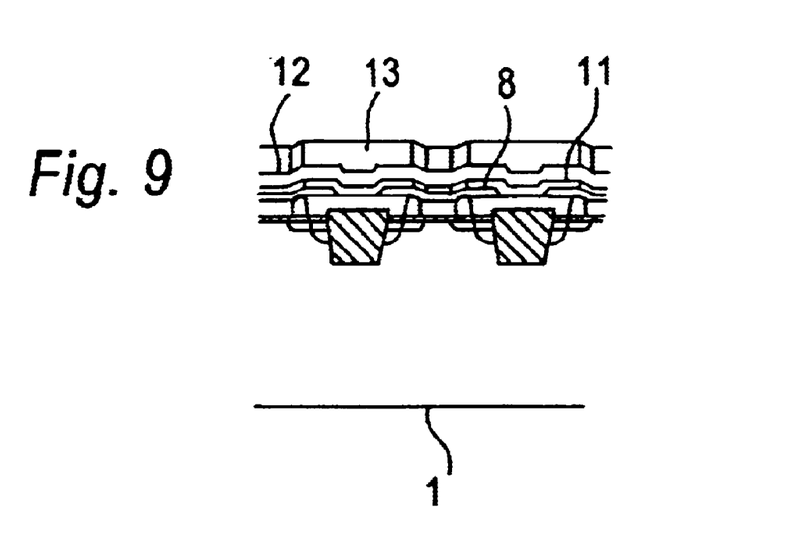
FIG. 9 is a diagram of a substrate wherein a doped amorphous silicon film, a WSi film and a TEOS oxide film are deposited on the ONO film.

FIG. 9 shows a substrate 1 wherein a doped amorphous silicon film 11, a WSi film 12 and a TEOS oxide film 13 are deposited on the ONO film 8. The doped amorphous silicon film 11 corresponds to the control gate 11 of the nonvolatile semiconductor device 100 (FIG. 1).

Figure 10:
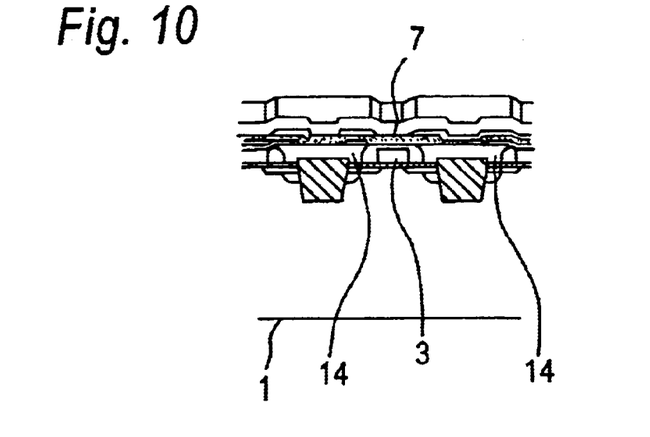
FIG. 10 is a diagram of a substrate wherein a void is generated through etching.

FIG. 10 shows a substrate 1 wherein a void 14 is generated through etching. In reference to FIG. 9, again, in the following the process of forming the void 14, which is one of the main manufacturing processes of the present invention, is shown as follows according to the structure as shown in FIG. 9. Here, in addition to the memory cell, the manufacturing process of the peripheral circuit part of the memory cell, which is formed in a parallel manner, is also described. The peripheral circuit part is provided in a region on the substrate on the side opposite to the memory cell part with respect to the element isolation region (hatched line part).

First, resist patterning is carried out for the TEOS film 13 in order to form word lines in the memory cell part and gates in the peripheral circuit part. After etching the TEOS film 13, by using this resist as a mask, the resist is removed. Next, by using the patterned TEOS film 13 as a mask, the WSi film 12 and the doped amorphous silicon film 11 are etched. Thereby, gates of transistors are formed in the peripheral circuit region.

In the memory cell region, the doped amorphous silicon film, which is the control gate 11, as well as the WSi film 12 are completely formed. However, the doped amorphous silicon film 3 and 7, which is the floating gate, is connected in the direction of the bit lines. Next, therefore, a resist pattern is formed wherein an aperture is created for only the memory cell part. By using the pattern of the previously formed three layers of the TEOS film 13, the WSi film 12 and the doped amorphous silicon film 11, anisotropic etching is carried out to the so-called ONO film, which is deposited on the doped amorphous silicon film 7. In addition, the doped amorphous silicon film 7 and 3 are patterned through anisotropic dry etching so as to remove the resist which has covered the peripheral circuit region. Thereby, the floating gates are etched in the direction of the bit lines so as to form memory cells.

After this, etching is carried out in the atmosphere of vapor phase HF. When an HF treatment is carried out in the vapor phase atmosphere only silica glass 6 (for example, FIG. 8) of high absorbency, which is formed beneath the doped amorphous silicon film 7, is selectively etched. The reason why etching is possible is that the vapor phase HF makes contact with the silica glass 6 (for example, FIG. 8) lying beneath the doped amorphous silicon film 7 between the word lines. Here, in the vapor phase HF treatment, oxide films such as a thermal oxide film, a CVD oxide film 1-1, 1-2 (FIG. 2) forming an STI, or the like, are little etched and only silica glass of high absorbency is etched. Etching progresses sufficiently fast in the silica glass film 6 of high absorbency unlike in a heat (thermal) oxide film or a TEOS film. In addition, a nitride film, the doped amorphous silicon film 11 and the WSi film 12 are also little etched. As described above, a void 14 can be provided as shown in FIG. 10.

As described so far, the main characteristic of the present invention is the existence of the void 14 beneath the fin 7. The air existing in the void has the relative dielectric constant of approximately 1. In the conventional nonvolatile semiconductor device 110 (FIG. 11) a CVD oxide film (TEOS film, or the like) of which the relative dielectric constant is approximately 4 is deposited in that region. Accordingly, the parasitic capacitance of the nonvolatile semiconductor device 100 according to the present invention can be restricted to approximately one fourth of the conventional parasitic capacitance. In addition, with respect to the height distance of the fin 7 from the substrate 1, dispersion can be caused depending on the degree of the amount of etching. Even in the case that dispersion is caused, however, the influence thereof can be restricted to approximately one fourth in comparison with a prior art. This is particular effective in the case that the fin 7 is formed in a low position due to an excessive amount of etching, because the parasitic capacitance generally increases in the case that the position of the fin 7 is low. As described above, by forming a void 14 beneath the fin 7, the absolute value of the parasitic capacitance decreases and the degree of fluctuation of the parasitic capacitance due to the manufacturing process can be restricted to a low amount. Accordingly, the nonvolatile semiconductor device 100, of which the performance is increased, can be obtained without lowering the yield.

After forming the void 14, Al wires are, finally, formed in order to electrically connect respective transistors so that the nonvolatile semiconductor device 100 is formed.

The nonvolatile semiconductor device 100 is processed in this manner. In the above description, a void 14 is provided beneath the fin 7 in order to make the parasitic capacitance lower in comparison with a prior art. However, another method exists for making the parasitic capacitance lower than in a prior art. That is to say, a material of a low relative dielectric constant is deposited below the fin 7 alternative to the void 14. The processes which are modified by adopting this method are the processes of FIG. 5 and FIG. 10. A nonvolatile semiconductor device can be obtained without modifying, at all, other processes. The contents of the modifications are specifically described in the following.

First, the process of FIG. 5 relates to the process of depositing a silica glass oxide film 6. In place of this silica glass oxide film, a layer of film of a material of a low relative dielectric constant, for example a layer of silicon oxide fluoride film (SiOF film), an amorphous carbon fluoride film (CF film) or a silicon oxide carbide film (SiOC film), may be deposited to the thickness of approximately 600 nm through CVD. The relative dielectric constants of these materials are approximately 1.8 to 3.0. Since the relative dielectric constant is 4 in a prior art, the parasitic capacitance can be reduced in the case that the relative dielectric constant is smaller than 4. However, the smaller the relative dielectric constant is the better and, preferably, it is approximately 3, or less, so as to make the parasitic capacitance sufficiently small in comparison with a prior art. In addition, the degree of the fluctuation of the parasitic capacitance due to the manufacturing process can also be made of a low level.

On the other hand, the process of FIG. 10 relates to the process of etching the deposited silica glass oxide film 6. In the case that a film of a material of a low relative dielectric constant is deposited the process of FIG. 10 becomes, naturally, unnecessary since no etching is required. In the above, a manufacturing process of the nonvolatile semiconductor device 100 is described.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A nonvolatile semiconductor device comprising:
   a substrate wherein two regions, a source region and a drain region, of a transistor are formed;
   a first insulating layer formed on the substrate;
   a conductive floating gate having an axis part formed on said first insulating layer and a fin part, extending above the two regions, connected to said axis part;
   a sidewall formed adjacent the axis part;
   voids formed between the fin part and the first insulating layer above the two regions;
   a second insulating layer formed on said fin part; and
   a conductive control gate formed on said second insulating layer,
   wherein said sidewall is sandwiched between the axis part and said voids.

2. A nonvolatile semiconductor device comprising:
   a substrate wherein two regions of a transistor are formed;
   a first insulating layer formed on the substrate;
   a conductive floating gate having an axis part formed on said first insulating layer and a fin part, extending above the two regions, connected to said axis part;
   a sidewall formed adjacent the axis part;
   a layer of a material having relative dielectric constant of 3 or less, formed between the fin part and the first insulating layer above the two regions;
   a second insulating layer formed on said fin part; and
   a conductive control gate formed on said second insulating layer,
   wherein said sidewall is sandwiched between the axis part and said layer of a material, and relative dielectric constant of said sidewall is larger than that of said layer of a material.

3. The nonvolatile semiconductor device according to claim 2, wherein said material having the relative dielectric constant of 3 or less, is formed of one of a silicon fluoride oxide, an amorphous carbon fluoride and a silicon carbide oxide.

* * * * *